(12) United States Patent
Catabay et al.

(10) Patent No.: US 6,472,314 B1
(45) Date of Patent: Oct. 29, 2002

(54) DIAMOND BARRIER LAYER

(75) Inventors: Wilbur G. Catabay, Saratoga; Zhihai Wang, Sunnyvale, both of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/968,944

(22) Filed: Oct. 2, 2001

(51) Int. Cl.$^7$ .............................................. H01L 21/768
(52) U.S. Cl. ...................................... 438/633; 438/687
(58) Field of Search ................................ 438/633, 674, 438/675, 687, FOR 355; 257/758

(56) References Cited

U.S. PATENT DOCUMENTS 6,284,657 B1 * 9/2001 Chooi et al. ................. 438/637

\* cited by examiner

*Primary Examiner*—George Fourson
*Assistant Examiner*—Suk-San Foong
(74) *Attorney, Agent, or Firm*—Luedeka, Neely & Graham, PC

(57) ABSTRACT

A method of forming an electrically conductive interconnect on a substrate. An interconnection feature is formed on the substrate, and a first barrier layer is deposited on the substrate. The first barrier layer consists essentially of a diamond film. A seed layer consisting essentially of copper is deposited on the substrate, and a conductive layer consisting essentially of copper is deposited on the substrate. Thus, by using a diamond film as the barrier layer, diffusion of the copper from the conductive layer into the material of the substrate is substantially reduced and preferably eliminated.

16 Claims, 1 Drawing Sheet

DIAMOND BARRIER LAYER

FIELD

This invention relates to the field of integrated circuit fabrication. More particularly, this invention relates to a process of forming a composite barrier layer including a diamond film for low-k dielectric interconnects.

BACKGROUND

As integrated circuits become more complex, it becomes necessary to develop new structures and fabrication techniques which tend to minimize the overall size of the integrated circuits. One technique for reducing the physical size of an integrated circuit is to form multi layered structures where metallic interconnects, separated by interlevel dielectric layers, define various electrical pathways. As the size of the circuit is reduced, electrical contacts, such as via holes and other structures, tend to be smaller and disposed in closer proximity to one another.

A typical integrated circuit fabrication process uses a barrier layer between the substrate and electrical interconnection conduction layers. After depositing the barrier layer, a seed layer is typically deposited. Finally, the conduction layer is deposited over the seed layer, followed by chemical mechanical or electro polishing of the various layers.

Often, the barrier layers do not provide adequate protection from diffusion of the material of the conduction layer or other layers into the material of the substrate. Such diffusion tends to corrupt the operation of the integrated circuit formed in the substrate. As the trend toward fabrication of devices having smaller feature sizes and higher performance continues, better materials and processes must be used to avoid fabrication problems such as that describe above. The careful selection of proper materials can achieve both better device performance and minimize production costs by improving the device yield during manufacturing.

What is needed, therefore, is a method for forming a barrier layer that more fully inhibits the material of the conduction layer or other layers from diffusing into unintended areas of the substrate.

SUMMARY

The above and other needs are met by a method of forming an electrically conductive interconnect on a substrate. An interconnection feature is formed on the substrate, and a first barrier layer is deposited on the substrate. The first barrier layer consists essentially of a diamond film. A seed layer consisting essentially of copper is deposited on the substrate, and a conductive layer consisting essentially of copper is deposited on the substrate. Thus, by using a diamond film as the barrier layer, diffusion of the copper from the conductive layer into the material of the substrate is substantially reduced and preferably eliminated.

In various preferred embodiments, a second barrier layer is deposited on the substrate prior to depositing the seed layer. The first barrier layer of diamond and the second barrier layer define a composite barrier layer. Most preferably the second barrier layer is at least one of tantalum, tantalum nitride, tungsten nitride, and titanium silicon nitride. The second barrier layer may, in various embodiments, be deposited using either a chemical vapor deposition process or physical vapor deposition process.

Preferably, the electrically conductive interconnect is planarized to a level substantially planar with a top surface of the substrate, most preferably with a chemical mechanical polishing process.

In another aspect of the invention an integrated circuit is described, which integrated circuit includes an electrically conductive interconnect formed according to the method as described above.

BRIEF DESCRIPTION OF THE DRAWINGS

Further advantages of the invention are apparent by reference to the detailed description when considered in conjunction with the FIGS. which are not to scale so as to more clearly show the details, wherein like reference numbers indicate like elements throughout the several views, and wherein.

DETAILED DESCRIPTION

Figure 1:
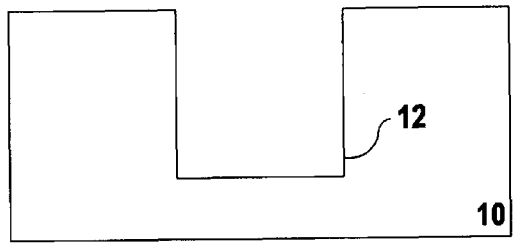
FIG. 1 is a cross sectional view of a substrate having an interconnect feature.

With initial reference to FIG. 1, a cross sectional depiction of a substrate 10 having an interconnect feature 12 is shown. It is appreciated that the interconnect feature 12 may include but is not limited to structures such as trenches and vias, and the invention is not intended to be limited by any specific such examples or embodiments. It is further appreciated that the substrate preferably includes many such interconnect features 12, which form parts of one or more integrated circuits. As described in more detail below, the substrate 10 provides a base structure for forming various electrical and structural features during the fabrication of an integrated circuit. The substrate 10 preferably includes portions of a low k material having a dielectric constant k that is close to about one. For example, the material of the substrate on either side of the interconnect feature 12 may be the low k material, while the material of the substrate below the interconnect feature 12 may be an electrically conductive layer, to which an electrical connection through the interconnect feature 12 is desired.

It is appreciated that, as used herein, the term substrate refers very broadly to the various layers and materials on which a newly formed layer is deposited. Thus, as each layer is deposited, it becomes a part of the substrate on which subsequent layers are deposited. The term substrate is also used to describe a base layer or layers, on which the various layers of more particular relevance to the invention as described herein are deposited. It is appreciated that the context in which the term substrate is variously used is sufficient to determine which specific definition of the term is intended. However, in many instances the specific definitions as described above are not mutually exclusive, and thus the term validly includes both such definitions.

In accordance with a preferred embodiment of the invention, the interconnect feature 12 is formed with an aspect ratio of at least about 5:1, where the aspect ratio as defined herein is the ratio of the depth of the interconnect feature 12 to the diameter or width of the interconnect feature 12. However, the interconnect feature 12 is not limited to aspect ratios of about 5:1 or greater. For example, the invention is just as applicable to an interconnect feature 12 having an aspect ratio of less than about 5:1, or to some interconnect features 12 having aspect ratios greater than about 5:1, while other interconnect features 12 have aspect ratios of less than about 5:1. However, the present invention provides an increase in benefits for interconnect features 12 having an aspect ratio of at least about 5:1.

Figure 2:
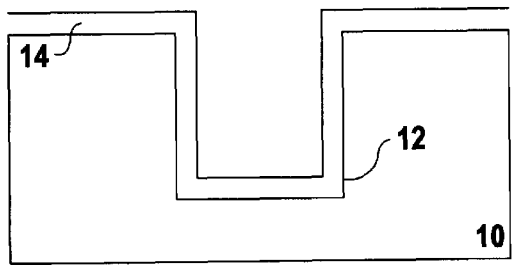
FIG. 2 is cross sectional view of the substrate of FIG. 1 after deposition of a first barrier layer.

Referring now to FIG. 2, and in accordance with a most preferred embodiment of the invention, a first barrier layer 14 of diamond is preferably deposited over the substrate 10, where the first barrier layer 14 of diamond also conformally coats the interconnect feature 12. The first barrier layer 14 of diamond most preferably has a thickness of less than about twenty angstroms. However the thickness of the first barrier layer 14 can also be greater than about twenty angstroms. However, this thickness is especially beneficial for high aspect ratio structures in small device size technologies. The method described herein is particularly effective for integrated circuits based on sub 0.18 nanometer technologies. In accordance with the most preferred embodiment of the invention, a chemical vapor deposition technique is used to deposit the first barrier layer 14 of diamond over the substrate 10 and interconnect feature 12.

As described above, the first barrier layer 14 of diamond, which is disposed adjacent the substrate 10, performs a barrier function, preferably prohibiting diffusion of the material of subsequently deposited layers, such as copper atoms, into the material of the substrate 10. This may be especially important for those substrates 10 that include low k material, as described above. However, not only does the first barrier layer 14 of diamond have beneficial barrier properties, the diamond film also has very conformal deposition properties for interconnect features 12 having aspect ratios of at least about 5:1, with step coverage of preferably at least about ninety percent. The diamond first barrier layer 14 is also mechanically strong.

Thus, the first barrier layer 14 of diamond is highly desirable because it can be deposited in a very thin, highly conformal layer, which works well with narrow, high aspect ratio features. Even at a very thin thickness, the diamond first barrier layer 14 functions well as a barrier layer to subsequent layers. This tends to be especially important when the lateral sidewalls of the structure are formed of low k materials, in to which the diffusion of other materials tends to produce severe problems. The low thickness of the diamond first barrier layer 14 is also beneficial, as it tends to reduce the occurrence of cusping at the top corners of the features on the substrate. Such cusping can result in the via being closed off at the top before the entire via is filled with conductive material, thus reducing the conductivity of the via.

Thus, the diamond first barrier layer 14 has a combination of benefits, including thinness, conformality, and diffusion resistance which optimally combine for use in small geometry integrated circuits. These benefits are especially useful when the conduction or other layers are formed of copper, which tends to readily diffuse into other materials, such as low k materials.

Figure 3:
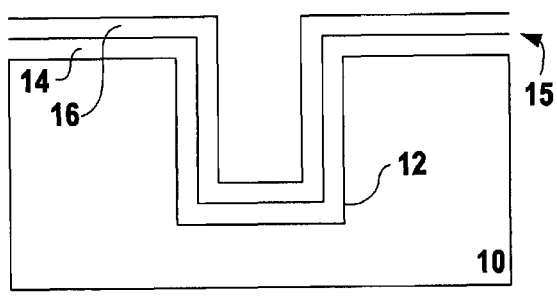
FIG. 3 is a cross sectional view of the substrate of FIG. 2 after deposition of a second barrier layer.

As shown in FIG. 3, a second barrier layer 16 is preferably formed on the substrate 10, disposed adjacent the first barrier layer 14 of diamond. Second barrier layer 16 preferably also provides a barrier function, further prohibiting the diffusion of materials from subsequent layers into the material of the substrate 10. The second barrier layer 16 preferably has one or more layers of at least one of tantalum, tantalum nitride, tungsten nitride, and titanium silicon nitride, deposited either by chemical vapor deposition or physical vapor deposition.

The first barrier layer 14 and the second barrier layer 16 most preferably define a composite barrier layer 15. The composition of the composite barrier layer 15 is dependent upon the compositions of layers 14 and 16. The composite barrier layer 15 tends to further improve the electrical properties of the integrated circuit to be formed in the substrate 10, since in addition to the distinct barrier properties of the first barrier layer 14 of diamond, the barrier properties of layer 16 act to further impede the diffusion of material from the conduction layer 20 and other layers into unintended areas of the substrate 10. Thus, the combined effect of layers 14 and 16 tends to substantially improve the electrical characteristics of any integrated circuit formed in the substrate 10.

Figure 4:
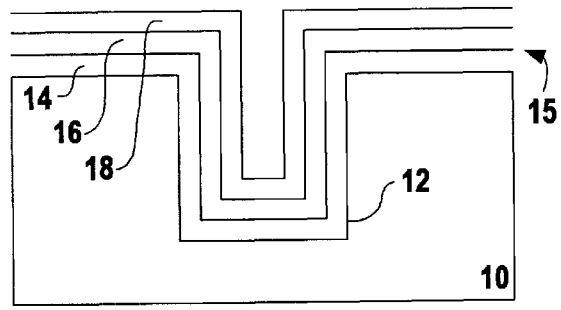
FIG. 4 is a cross sectional view of the substrate of FIG. 3 after deposition of a seed layer.
Figure 5:
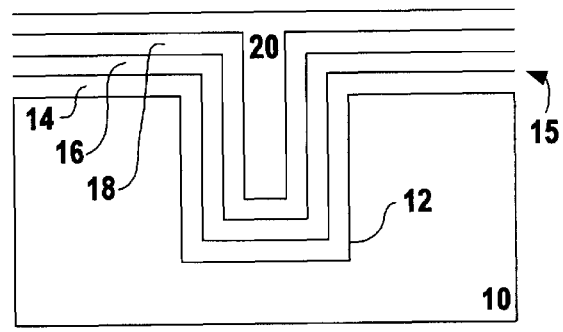
FIG. 5 is a cross sectional view of the substrate of FIG. 4 after deposition of a conduction layer.

Referring now to FIGS. 4 and 5, a seed layer 18, preferably of the same material as the subsequently deposited conduction layer, is deposited over the substrate 10, and disposed adjacent the second barrier layer 16. The seed layer 18 may be deposited over the second barrier layer 16 using either a physical vapor deposition or a chemical vapor deposition. After depositing the seed layer 18, a conduction layer 20 is preferably formed on the substrate 10, and disposed adjacent the seed layer 18. In a most preferred embodiment, the seed layer 18 and the conduction layer 20 are both formed of copper. The conduction layer 20 is most preferably formed by electroplating. The seed layer 18 preferably functions as an electrode during electroplating of the conduction layer 20.

Figure 6:
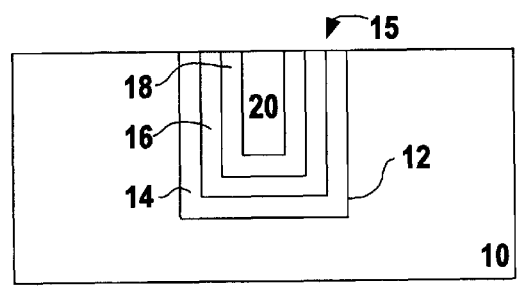
FIG. 6 is a cross sectional view of the substrate of FIG. 5 after planarization of the electrically conductive interconnect.

Once the various layers of the electrically conductive interconnect have been formed, the structure is preferably planarized, as depicted in FIG. 6, most preferably using either a chemical mechanical polishing process or an electro polishing process. The electrically conductive interconnect is preferably planarized to the level of the top surface of the substrate 10.

An integrated circuit manufactured as described above tends to have superior electrical characteristics over an integrated circuit manufactured according to typical processes. The composite barrier layer 15, composed of the first barrier layer 14 of diamond film and second barrier layer 16, operates to impede the diffusion of copper to unintended areas of the integrated circuit. Since the copper atoms are substantially prohibited from diffusing to unintended areas of the integrated circuit, the electrical performance and characteristics of the integrated circuit are greatly improved.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A method of forming an electrically conductive interconnect on a substrate, the method comprising the steps of:
   (a) forming an interconnect feature on the substrate,
   (b) depositing a first barrier layer on the substrate, the first barrier layer consisting essentially of a diamond film,
   (c) depositing a seed layer consisting essentially of copper on the substrate, and
   (d) depositing a conductive layer consisting essentially of copper on the substrate.

2. The method of claim 1, further comprising the step of depositing a second barrier layer on the substrate between step (b) and step (c), the first barrier layer and the second barrier layer defining a composite barrier layer.

3. The method of claim 2 wherein the step of depositing the second barrier layer comprises depositing at least one of tantalum, tantalum nitride, tungsten nitride, and titanium silicon nitride.

4. The method of claim 2 wherein the step of depositing the second barrier layer comprises deposition with a chemical vapor deposition process.

5. The method of claim 2 wherein the step of depositing the second barrier layer comprises deposition with a physical vapor deposition process.

6. The method of claim 1, further comprising the step of:
   (e) planarizing the electrically conductive interconnect to a level substantially planar with a top surface of the substrate.

7. The method of claim 6 wherein step (e) comprises planarizing using a chemical mechanical polishing process.

8. The method of claim 1 wherein step (a) comprises forming the interconnect feature with an aspect ratio of at least about 5:1.

9. The method of claim 1 wherein step (b) comprises depositing the first barrier layer using a chemical vapor deposition process.

10. The method of claim 1 wherein step (c) further comprises depositing the seed layer using a chemical vapor deposition process.

11. The method of claim 1 wherein step (c) comprises depositing the seed layer using a physical vapor deposition process.

12. The method of claim 1 wherein step (d) comprises depositing the conductive layer of copper using an electroplating process.

13. An integrated circuit, the improvement comprising an electrically conductive interconnect formed according to the method of claim 1.

14. A method of forming an electrically conductive interconnect on a substrate, the method comprising the steps of:
   (a) forming an interconnect feature on the substrate,
   (b) depositing a first barrier layer on the substrate, the first barrier layer consisting essentially of a diamond film,
   (c) depositing a second barrier layer on the substrate, the second barrier layer consisting essentially of at least one of tantalum, tantalum nitride, tungsten nitride, and titanium silicon nitride, the first barrier layer and the second barrier layer defining a composite barrier layer,
   (d) depositing a seed layer consisting essentially of copper on the substrate,
   (e) electroplating a conductive layer consisting essentially of copper on the substrate, and
   (f) planarizing the electrically conductive interconnect to a level substantially planar with a top surface of the substrate.

15. The method of claim 14 wherein the substrate further comprises at least a layer of a low dielectric constant material.

16. An integrated circuit, the improvement comprising an electrically conductive interconnect formed according to the method of claims 14.

* * * * *